United States Patent
Yoon et al.

(10) Patent No.: US 7,514,331 B2
(45) Date of Patent: Apr. 7, 2009

(54) METHOD OF MANUFACTURING GATE SIDEWALLS THAT AVOIDS RECESSING

(75) Inventors: Jong Shik Yoon, San Diego, CA (US); Amitava Chatterjee, Plano, TX (US); Haowen Bu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 315 days.

(21) Appl. No.: 11/422,952

(22) Filed: Jun. 8, 2006

(65) Prior Publication Data

US 2007/0287258 A1 Dec. 13, 2007

(51) Int. Cl.
H01L 21/336 (2006.01)
(52) U.S. Cl. .............................. 438/303; 257/E21.626; 257/E21.64
(58) Field of Classification Search ................ 438/300, 438/303; 257/E21.626, E21.64
See application file for complete search history.

(56) References Cited

U.S. PATENT DOCUMENTS

| | | | |
|---|---|---|---|
| 6,551,887 B2 | 4/2003 | Kwon et al. | |
| 6,806,149 B2 | 10/2004 | Bu et al. | |
| 6,930,007 B2 | 8/2005 | Bu et al. | |
| 7,012,028 B2 | 3/2006 | Bu et al. | |
| 7,018,888 B2 | 3/2006 | Goodlin et al. | |
| 2005/0250287 A1* | 11/2005 | Chen et al. | ................... 438/300 |
| 2006/0084234 A1 | 4/2006 | Tews | |

OTHER PUBLICATIONS

U.S. Appl. No. 11/074,905 entitled "A Method for Manufacturing a Semiconductor Device Using a Sidewall Spacer Etchback", filed Mar. 8, 2005.
U.S. Appl. No. 10/902,902 entitled "A Method for Manufacturing Improved Sidewall Structures for Use in Semiconductor Devices", filed Jul. 30, 2004.

* cited by examiner

*Primary Examiner*—Walter L Lindsay, Jr.
(74) *Attorney, Agent, or Firm*—Wad J. Brady, III; Frederick J. Telecky, Jr.

(57) ABSTRACT

A method of manufacturing a semiconductor device comprising removing a first oxide layer deposited over a semiconductor substrate, thereby exposing source and drain regions of the substrate. The first oxide layer is configured as an etch-stop for forming silicon nitride sidewall spacers of a gate structure located adjacent to the source and drain regions. The method further comprises depositing a second oxide layer selectively on the exposed source and drain regions and then removing lateral segments of the silicon nitride sidewall spacers.

19 Claims, 6 Drawing Sheets

METHOD OF MANUFACTURING GATE SIDEWALLS THAT AVOIDS RECESSING

TECHNICAL FIELD

This invention is related to the field of semiconductor devices and more specifically to a novel process to avoid recessing in metal silicide contact regions of such devices.

BACKGROUND

Scaling down semiconductor devices, such as metal oxide semiconductor (MOS) transistors, to deep sub-micron dimensions has required changes in gate sidewall structures and materials from all silicon oxide, to all silicon nitride, to a combination of silicon oxide and silicon nitride sidewalls. To increase the space between gate structures for a metal silicide source drain electrode and a pre-metal layer dielectric (PMD), the silicon nitride and oxide sidewalls are trimmed back after dopant implantation. Unfortunately, devices produced in this fashion have a higher than desired run-to-run variability in current leakage.

Accordingly, what is needed is a method for manufacturing semiconductor devices that that addresses the drawbacks of the prior art methods and devices.

SUMMARY

The invention provides a method manufacturing a semiconductor device. The method comprises removing a first oxide layer deposited over a semiconductor substrate, thereby exposing source and drain regions of the substrate. The first oxide layer is configured as an etch-stop for forming silicon nitride sidewall spacers of a gate structure located adjacent to the source and drain regions. The method further comprises depositing a second oxide layer selectively on the exposed source and drain regions and then removing lateral segments of the silicon nitride sidewall spacers.

Another aspect of the invention is a method of manufacturing an integrated circuit comprising forming one or more metal-oxide-semiconductor (MOS) transistor over a semiconductor substrate by the above-described method. The method also includes forming insulating layers over the MOS transistors and forming interconnections that contact the MOS transistors.

Another embodiment of the invention comprises semiconductor device having source and drain regions in a semiconductor substrate and a gate structure on the substrate and adjacent the source and drain regions. The gate structure comprises L-shaped silicon nitride sidewall spacers formed by above-described method.

DRAWINGS

Figure 1:
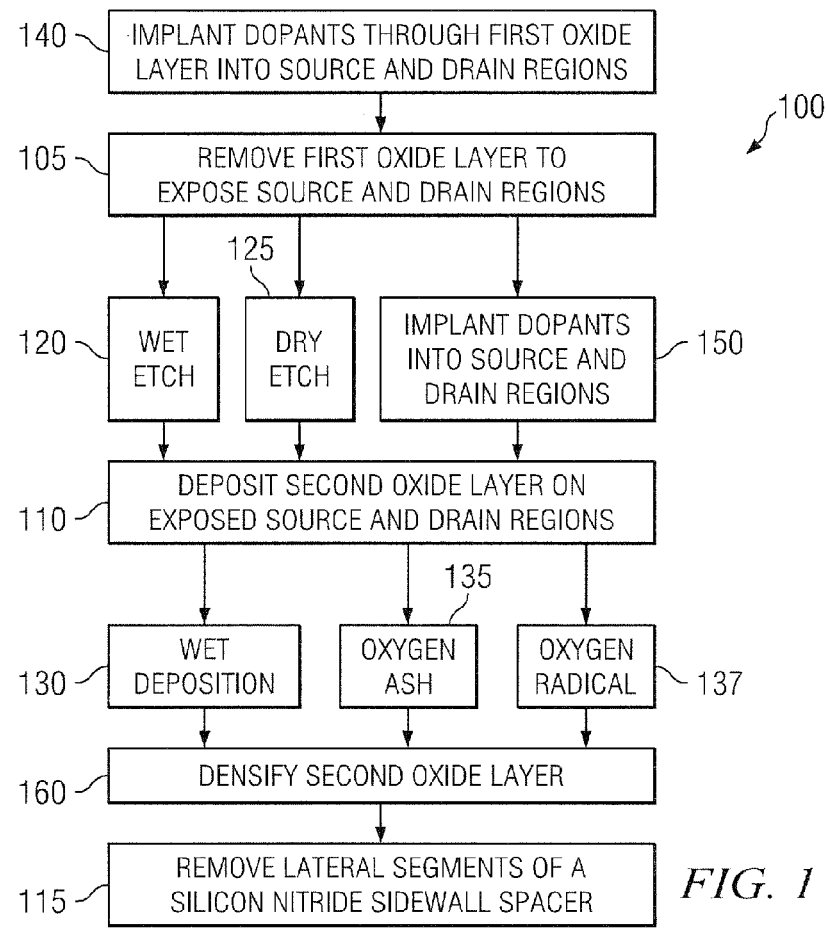

The invention is described with reference to example embodiments and to accompanying drawings, wherein:

FIG. 1 shows a flow diagram of an example method of manufacturing a semiconductor device according to the invention FIGS. 2 to 10 illustrate cross-section views of selected steps in an example implementation of a method of manufacturing a semiconductor device of the invention.

DETAILED DESCRIPTION

As part of the invention, it was discovered that certain processes used to pull or trim back a silicon nitride sidewall causes recessing into the semiconductor substrate of the device. It was found that an oxide layer above the source and drain regions of the device gets damaged when source and drain dopants are implanted through it and into the source and drain regions. The damage is sufficient to allow chemicals of the trim-back process to diffuse through the oxide layer and etch the substrate. Because the extent of damage done to the oxide layer can vary from one manufacturing run to another, the extent of recessing is variable. Creating recesses of variable size in the source and drain regions is believed to contribute to the higher than desired run-to-run variability in the device's current leakage.

These discoveries lead to the realization that substrate recessing can be avoided by removing the oxide layer and replacing it with another oxide layer prior to the silicon nitride sidewall trim-back process. In some cases, it is an implantation-damaged cap oxide layer that is replaced. In other cases, the cap oxide layer is removed before dopant implantation, and the protective oxide layer is formed on the substrate before performing the silicon nitride sidewall trim-back process.

One embodiment of the invention is a method of manufacturing a semiconductor device. FIG. 1 shows a flow chart of an example method 100 of manufacturing a semiconductor device according to the invention.

The method 100 comprises a step 105 of removing a first oxide layer deposited over a semiconductor substrate, thereby exposing source and drain regions of the substrate. The first oxide layer is configured as an etch-stop for forming silicon nitride sidewall spacers of a gate structure located adjacent to the source and drain regions of the device. The method further comprises a step 110 of depositing a second oxide layer selectively on the exposed source and drain regions. Then, in step 115 of the method, lateral segments of the silicon nitride sidewall spacers are removed.

In some embodiments, it is preferable that removing the first oxide layer in step 105 and depositing the second oxide layer in step 110 are both accomplished at a low thermal budget (e.g., at temperatures of about 400° C. or less). Performing these steps 105, 110 with as low a thermal budget as possible is preferred because this minimizes the diffusion of any dopants implanted into the substrate (e.g., source and drain or source/drain extension dopants).

In some cases, removing the first oxide layer in step 105 comprises a wet etch step 120 or a dry etch step 125 conducted at temperatures of about 200° C. or less and in some cases about 100° C. or less. The wet etch step 120 can comprise a dilute aqueous hydrofluoric acid (HF) solution (e.g., less than about 1 vol % HF and more preferably about 0.5 vol %). The dry etch step 125 can comprise a plasma etch using a fluorocarbon etchant such as $CH_3F$.

Some preferred methods of depositing the second oxide layer in step 110 include a wet deposition step 130 comprising hydrogen peroxide, ozone or a mixture thereof at temperatures of about 60° C. or less. For example, about 5% hydrogen peroxide, 100 ppm ozone solution, or both can be used. In other cases, depositing the second oxide layer comprises an oxygen ash step 135 at temperatures of about 100° C. or less. For example, the oxygen ash process condition can comprise about 1.5 torr pressure, about 1500 sccm oxygen, about 1000 sccm of a mixture of nitrogen and hydrogen, and a microwave power of about 1500 Watts. Alternatively, in step 137, an oxygen radical process at temperatures of about 500° C. or less, can be used.

In some preferred embodiments, source and drain dopants are implanted, in step 140, through the first oxide layer and into the source and drain regions. In alternative embodiments, in step 150, dopants are implanted into the source and drain regions after removing the first oxide layer in step 105, but before depositing the second oxide layer in step 110. It is preferable that no dopants are implanted into the second oxide layer prior to removing the lateral segments in step 115. Implanting dopants into the second oxide layer could form pin-hole defects in this layer, thereby allowing silicon nitride sidewalls etchants to diffuse through the layer and to form recesses in the substrate.

It is preferable to densify the second oxide layer, in step 160, e.g., by a thermal anneal, prior to removing the lateral segments in step 115. The term densified as used here refers to a reduction in the physical thickness of the second oxide layer by about 3% or more when an anneal at about 1000° C. or more is performed. Densifying the second oxide layer makes the layer more impervious to the silicon nitride sidewall spacer etchants used in step 115. Typically, the etch rate of the second oxide layer in aqueous acid is reduced after its densification and any potential pin holes in the oxide is repaired, thereby decreasing the potential for recess formation in the substrate.

Preferred embodiments of removing the lateral segments of the silicon nitride sidewall spacers in step 115, include a wet etch that removes the silicon nitride sidewall spacers at least about 100 times faster than the second oxide layer. In some instances, the wet etch comprises trim-back etchants of phosphoric acid. The wet etch can comprise hot phosphoric acid, e.g., pure liquid phosphoric acid or aqueous solutions of phosphoric acid (e.g., at least about 80 volume % phosphoric acid) at a temperature ranging from about 100 to 160° C.

Figure 2:
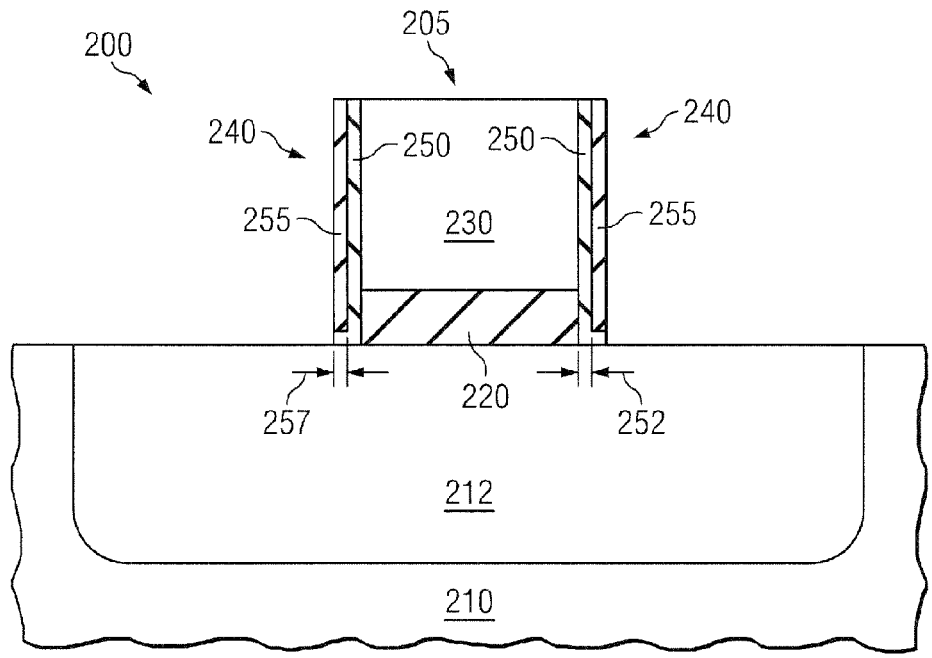

FIGS. 2 to 6 present cross-section views of selected steps in an example method of manufacturing a semiconductor device 200. FIG. 2 shows the device 200 after forming a gate structure 205 on a semiconductor substrate 210. In preferred embodiments the substrate 210 comprises bulk silicon substrates, semiconductor on insulator substrates, such as a silicon-on-oxide (SOI) substrate, including strained silicon on insulator, such as silicon germanium-on-insulator, germanium-on-insulator or similarly configured semiconducting materials. The substrate 210 can be doped with suitable n-type or p-type dopants to form a doped well 212 for a PMOS or nMOS device, respectively.

Forming the gate structure 205 can comprise forming a gate insulator 220, a gate electrode 230, and gate sidewall structures 240, using techniques such as described previously in e.g., U.S. Pat. Nos. 6,806,149, 6,930,007, 7,012,028, 7,018,888, and U.S. patent application Ser. No. 11/074,905 which are incorporated in their entirety by reference herein. The gate insulator 220 can be formed by growing or depositing on the substrate, materials such as silicon dioxide, a high dielectric constant (k) material, or similar methods, by using thermal grow or low-pressure chemical vapor deposition (CVD), or similar methods. The gate electrode 230 can be formed by depositing polysilicon or other conductive material (e.g., metal gate layers) using conventional procedures. E.g., polysilicon precursors, such as $SiH_4$ or $Si_2H_6$ can be deposited by low-pressure CVD. Deposited or grown layers of insulating and polysilicon can be patterned to form the gate insulator 215 and gate electrode 230 using conventional photolithographic techniques.

The gate sidewalls 240 can comprise one or more source/drain extension sidewalls and deeply doped source and drain sidewalls. The source/drain extension sidewalls can comprise a thin silicon oxide spacer 250 (e.g., a thickness 252 of less than about 15 nanometers) and thin silicon nitride spacer 255 (e.g., a thickness 257 of less than about 20 nanometers). E.g., forming the silicon oxide spacer 250 can comprise forming an oxide layer by thermal oxidation or a CVD process, followed by an anisotropic etch to form the silicon oxide spacer 250. The silicon nitride spacer 255 can be similarly formed by anisotropic etching a nitride layer deposited over the silicon oxide spacer 250.

Figure 3:
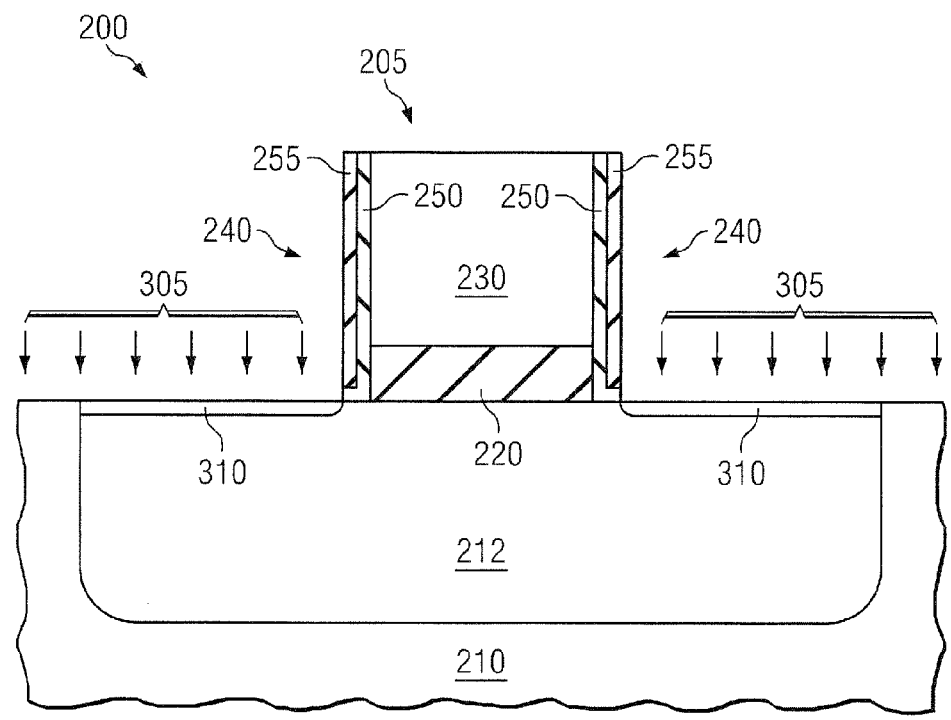

FIG. 3 shows the device 200 after implanting source/drain extension dopants 305 into the gate electrode 230 and the substrate 210, and more preferably, source/drain extension regions 310 in the well 212. E.g., a low energy, high dose implantation (e.g., a peak dopant concentration of about 1E19 to 2E20 atoms/cm$^3$) of n-type or p-type dopants can be implanted into source/drain extension regions 310 using conventional procedures.

Figure 4:
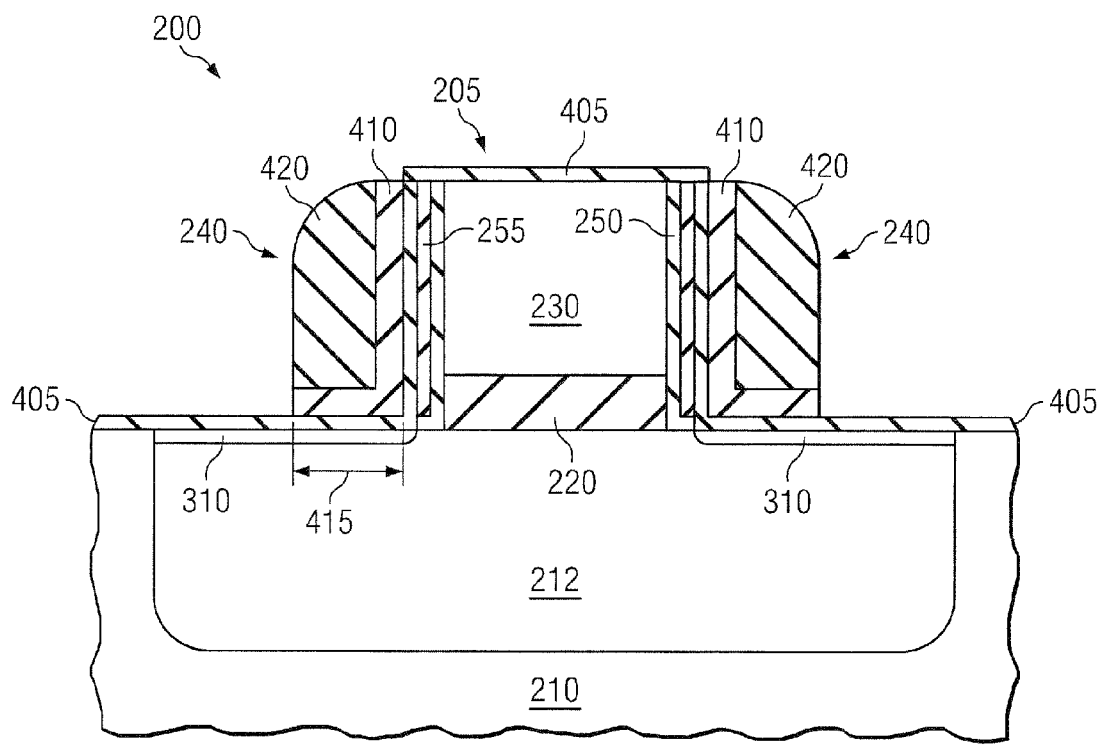

FIG. 4 also shows the device 200 after forming a first oxide layer 405 over the above-described gate structures 205 and the substrate 210. The first oxide layer 405 comprises a portion of the gate sidewalls 240. In some cases, the first oxide layer 405 is a cap oxide layer that deters the diffusion of dopants out of the substrate 210 and gate electrode 230. The first oxide layer 405 can be formed by substantially the same procedures used to deposit the oxide of the silicon oxide spacer 250 (FIG. 2) or by other conventional techniques.

FIG. 4 shows the device 200 after forming silicon nitride sidewall spacers 410 on opposing sides of the gate electrode 230. As further illustrated in FIG. 4, the sidewall spacers 410 can be L-shaped sidewall spacers, having lateral extensions 415. The sidewall spacers 410 can be formed as described e.g., in the U.S. Pat. Nos. 6,930,007 and 7,018,888 patents, or patent application Ser. No. 11/074,905. E.g., a conventional rapid thermal CVD (RTCVD) process, or a batch furnace process, to deposit a silicon nitride layer can be used as part of the process to form the sidewall spacers 410. Forming the sidewall spacers 410 can further comprise an anisotropic etch of the deposited silicon nitride layer, with the first oxide layer 405 configured as an etch stop layer for the anisotropic etch. Alternatively, silicon nitride, and in some cases silicon carbon nitride, can be deposited using bis t-butylaminosilane (BT-BAS) with ammonia ($NH_3$) precursors, or dicholosilane ($SiH_2Cl_2$) with ammonia ($NH_3$) precursors, in a CVD reactor.

As further illustrated in FIG. 4 a silicon oxide sidewall 420 can be formed on the silicon nitride sidewall spacer 410, by depositing and patterning a silicon oxide layer using similar processes to that described above for the silicon nitride sidewalls. E.g., the silicon oxide layer can be blanket deposited and then subjected to an anisotropic etch.

Figure 5:
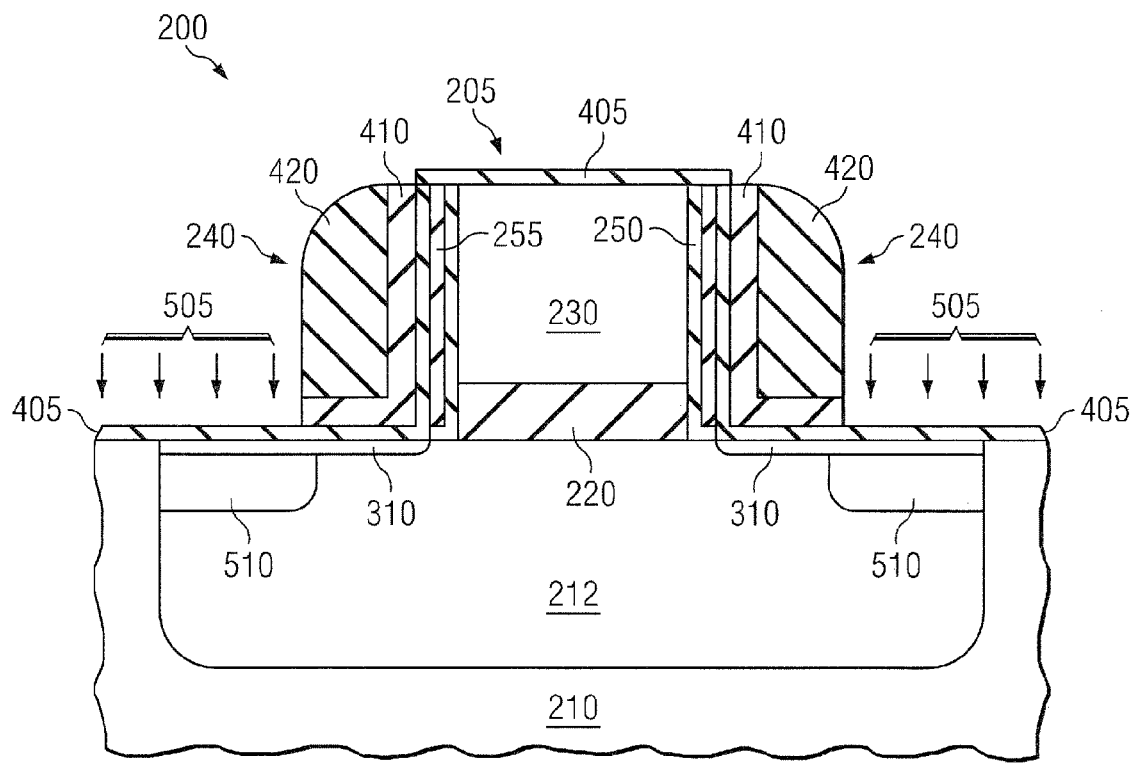

In accordance with step 140 (FIG. 1), in FIG. 5, dopants 505 are implanted through the first oxide layer 405 and into the gate electrode 230 and the source and drain regions 510 of the substrate 210, and more preferably the well 212. E.g., a high dose (e.g., a peak dopant concentration of about 1E18 to about 1E21 atoms/cm$^3$) dopant implantation of n-type or p-type dopants can be made into source and drain extension regions 510 using conventional procedures. Preferably, the implant energy is higher than that used in the source/drain extension implants.

Figure 6:
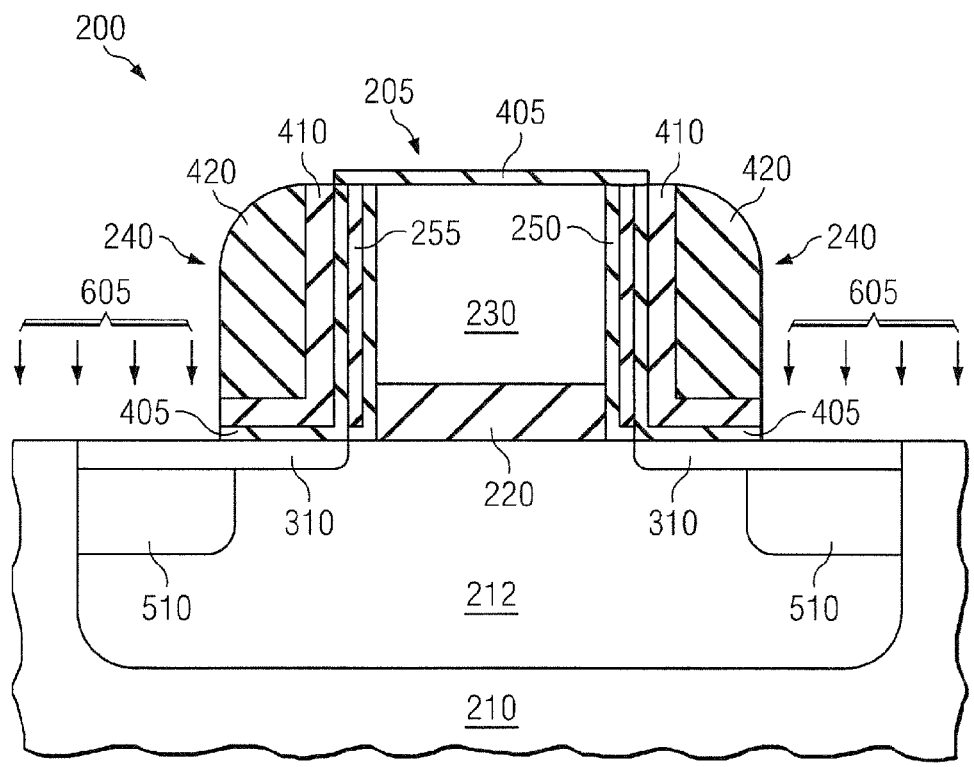

FIG. 6 shows the device 200 after removing the first oxide layer 405 (FIG. 5), as per step 105 (FIG. 1). The oxide can be removed by a wet or dry etch in accordance with step 120. In some cases, the first oxide layer 405 removed has dopants implanted through it as discussed above in the context of FIG. 5. In an alternative embodiment to that shown in FIG. 5, as per step 150 (FIG. 1), dopants 605 are implanted into the source and drain regions 510 after removing the first oxide layer 405, but before depositing the second oxide layer as per step 110.

Figure 7:
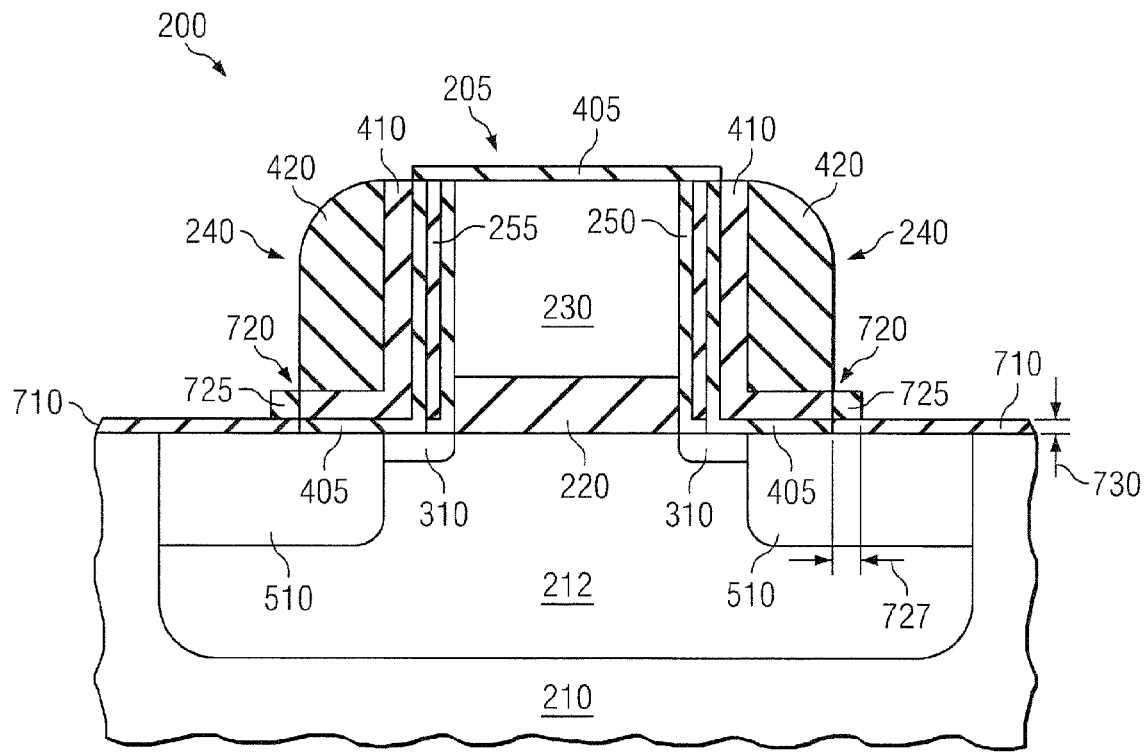

FIG. 7 shows the device 200 after depositing a second oxide layer 710 selectively on the exposed source and drain regions 510 as per step 110 (FIG. 1). In some preferred embodiments, forming the second oxide layer 710 comprises a wet deposition, an oxygen ash process or a low temperature oxygen radical process in accordance with steps 130, 135, 137 respectively (FIG. 1). The deposition of the second oxide layer 710 is not a blanket deposition process, but rather the oxide is selectively deposited on exposed areas of the substrate 210, e.g., the source and drain regions, that are not covered by gate structures 205. For example, selective deposition can be achieved by optimizing microwave power, temperature, pressure and gas flows. Selective deposition can be achieved with a combination low microwave power, high pressure and low temperature. In some cases, the oxide, in addition to being, deposited on the source and drain regions 510, is also deposited on an exposed surface 720 of the sidewall spacer 410. In such cases, the oxide can react with the exposed surface 720 to form a thin silicon oxynitride segment 725, preferably with a thickness 727 of less than about 1 nanometer.

In some preferred embodiments, the second oxide layer 710 has a thickness 730 ranging from about 0.5 to 1.5 nanometers. As discussed above in the context of step 160 (FIG. 1) the second oxide layer can be densified, resulting is a reduction in the thickness 730 of the second oxide layer by about 3% or more. It is desirable, and in some cases critical, to keep the thickness 730 at about 1.5 nm or less to prevent excessive oxide formation on the exposed portion 720 of the sidewall spacer 410. Greater thickness than this can cause the segment 725 formed on the exposed portion 720 of the sidewall 410 to comprise silicon oxide. A silicon oxide segment covering the sidewall spacer 410 is undesirable because the oxide can prevent the trim-back etchants used in step 115 from removing horizontal segments of the sidewall spacer 410. This in contrast to a silicon oxynitride segment 725, which is not detrimental because it can still be etched by the trim-back etchants used in step 115. It is also desirable, and in some cases critical, for the thickness 730 to be at least about 0.5 nm to ensure that there is a uniform coverage of oxide over the silicon substrate 210. Lower thickness than this can be insufficient prevent the trim-back etchants used in step 115 (FIG. 1) from penetrating the layer 710 and cause recessing of the substrate 210.

In some preferred embodiments, after implanting the dopants 305 (FIG. 3) and forming the second oxide layer 710 (FIG. 7), the device 200 can be subject to a high temperature thermal anneal to diffuse dopants into the source/drain extension 310 and source and drain regions 510. The anneal also beneficially densies the second oxide layer 710 as per step 160 (FIG. 1). The anneal can comprise the same conditions discussed in the U.S. Pat. Nos. 6,930,007, 7,018,888 patents, or patent application Ser. No. 11/074,905. E.g., the thermal anneal can comprise a temperature of greater than about 800° C., and more preferably, about 900 to 1300° C., for a period ranging from about 1 to 30 seconds. In other embodiments, however, the anneal can be done at a different stage in the process, e.g., after removing the lateral segments as per step 115.

Figure 8:
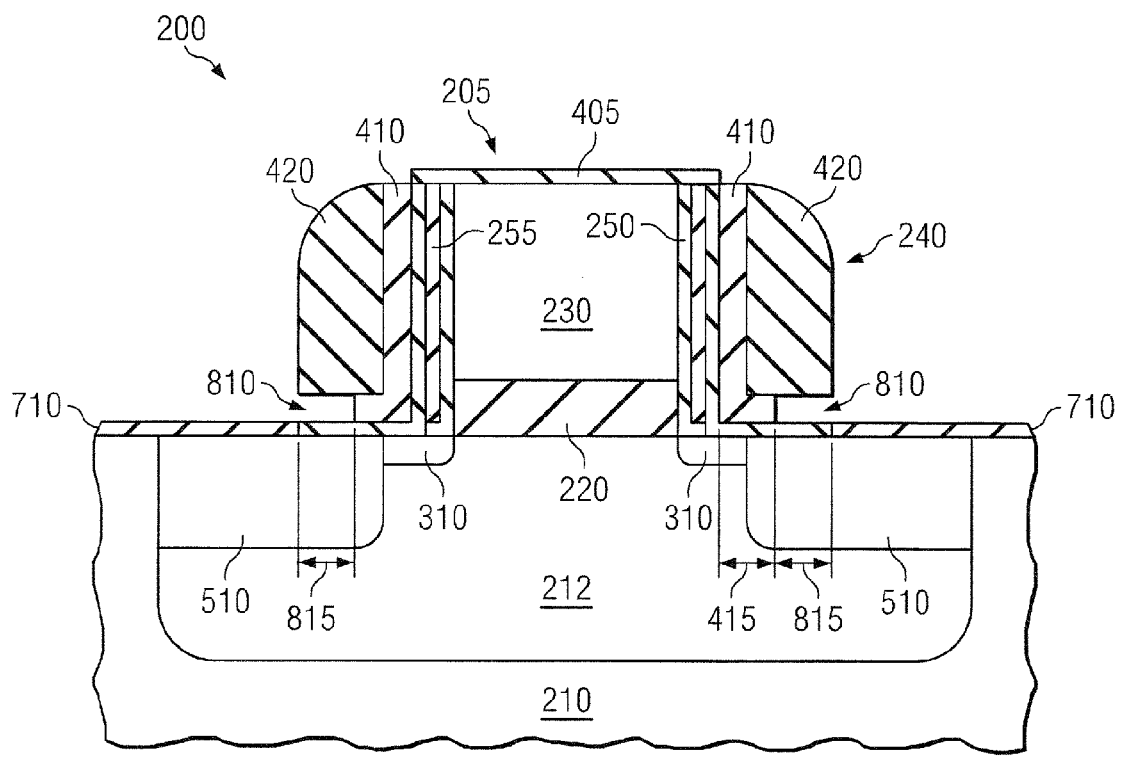

FIG. 8 shows the device 200 after removing lateral segments 810 of the silicon nitride spacer 410 in accordance with step 115 (FIG. 1). In some cases the lateral extensions 415 of each of the sidewall spacers 410 is reduced by a length 815 of up to about 30 nm. In some preferred embodiments, the length 815 removed ranges from about 5 to 10 nm. The second oxide layer 710 protects the substrate 210 from the trim-back etchants used to accomplish removal in step 115, thereby preventing recessing of the source and drain regions 510.

Figure 9:
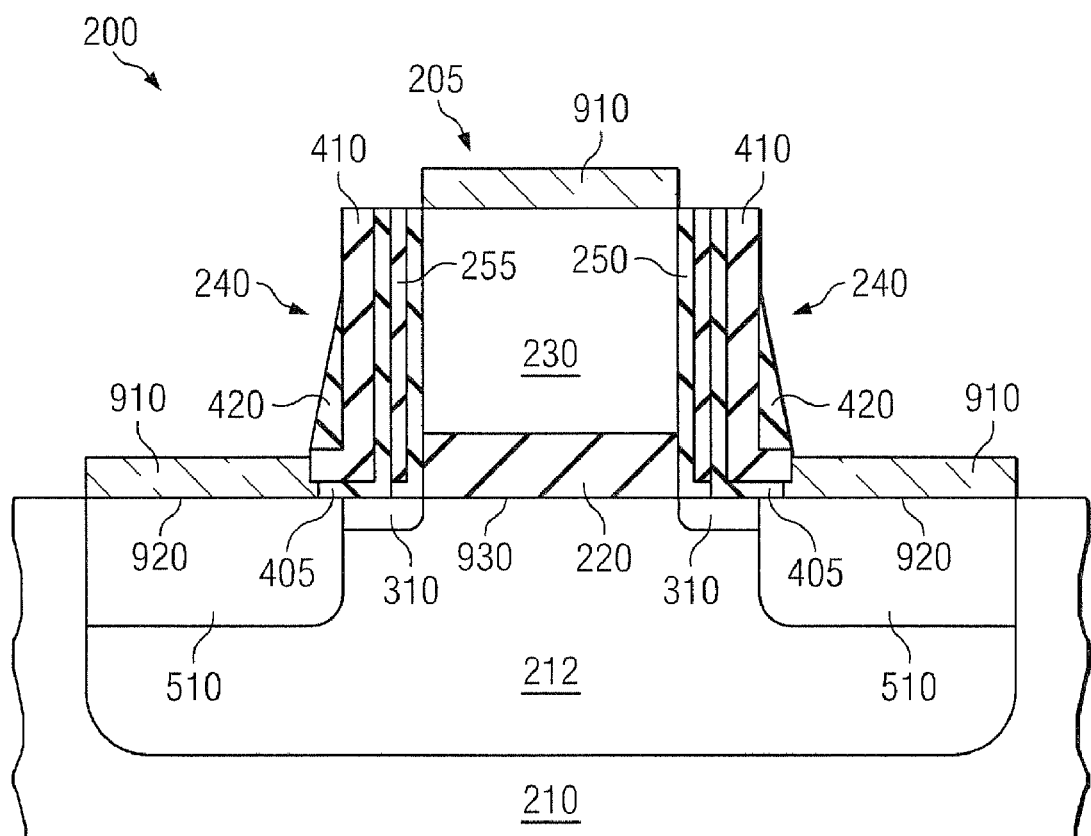

FIG. 9 shows the device 200 after removing the second oxide layer 710 (FIG. 8) and forming metal silicide electrodes 910 on the source and drain regions 510 formerly covered by the second oxide layer 710. Preferably, a metal silicide electrode is also formed over the gate electrode 230 as part of the process.

The second oxide layer 710 (FIG. 8) can be removed using the same procedures as used to remove the first oxide layer in step 105 (e.g., a dilute HF wet etch). The same process to remove the oxide layer 710 can also be used to remove portions of the silicon oxide spacer 250 and the silicon oxide sidewall 420, as illustrated in FIG. 9. It is important to remove the second oxide layer 710 from the surfaces 920 that metal silicide electrodes 910 are to be formed on because oxides can prevent the formation of silicide.

After removing the second oxide layer 710, the electrodes 910 are preferably formed on a non-recessed surface 920 of the substrate 210 that comprises the source and drain regions 510. Some of the substrate may be lost from the non-recessed surface 920, due to, e.g., a sidewall spacer over-etch. Preferably, however, the non-recessed surface 920 lays no more than about 10 nanometers below a surface 930 that the gate insulator 220 lies on. Preferably, the extent of substrate lost from the surface 920 is uniform. As an example the RMS (root-mean-square) height variation of the non-recessed surface 920 is less than about 0.5 nanometers.

The metal silicide electrodes 910 can be formed e.g., as discussed in the U.S. Pat. Nos. 6,930,007, 7,018,888 patents, or patent application Ser. No. 11/074,905. E.g., a metal layer of cobalt or nickel, can be deposited over the substrate 210 and gate structure 205, soon after the second oxide layer 710 is removed (e.g., within about 2 hours}. The metal layer can be subject to an anneal (e.g., temperature ranging from about 300 to 500° C.), causing the metal to react with the silicon of the substrate 210 and the gate electrode 230, to form the metal silicide electrodes 910.

Figure 10:
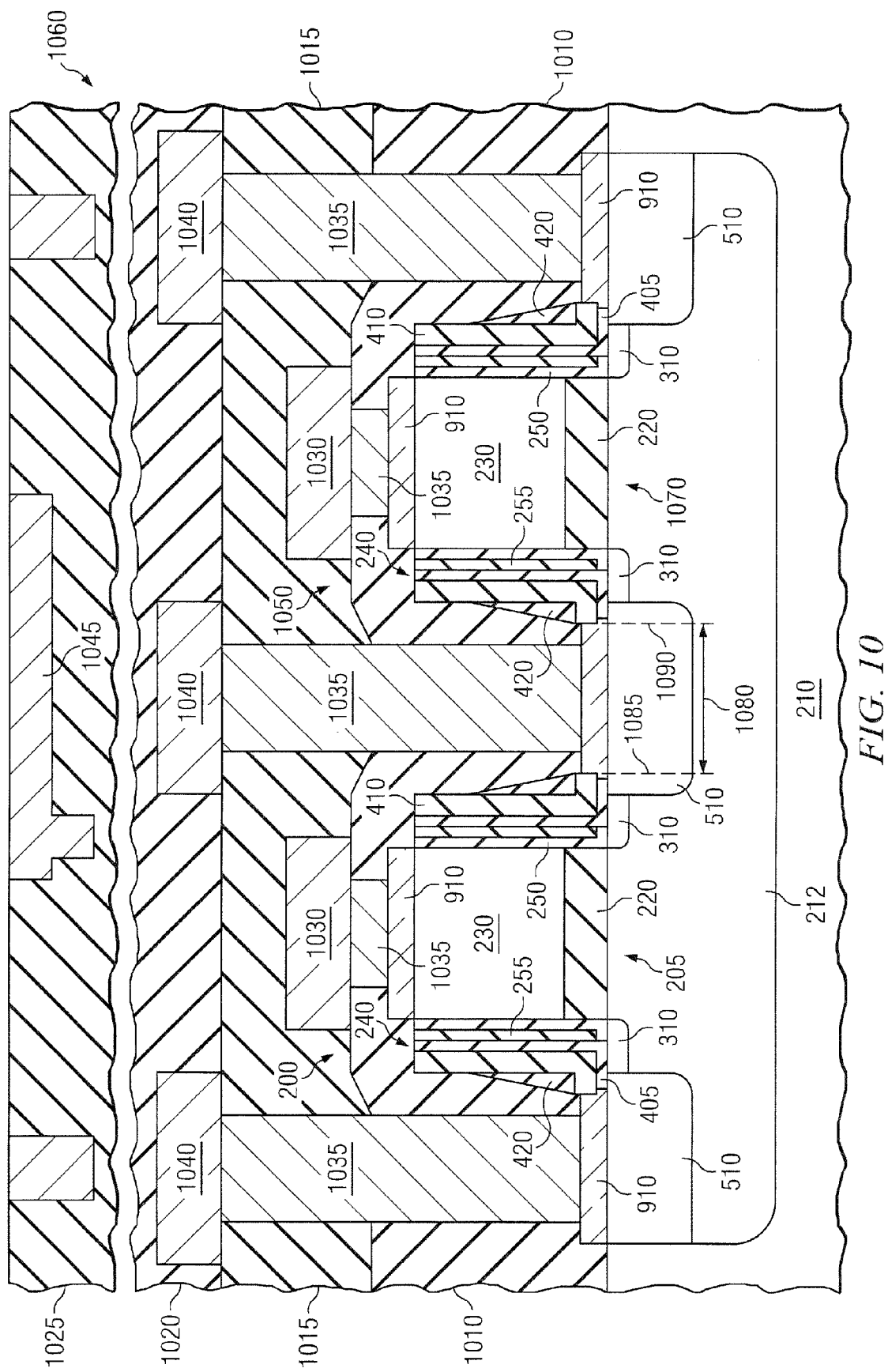

FIG. 10 show the device 200 after forming insulating layers 1010, 1015, 1020, 1025 over the device 200 and forming interconnections 1030, 1035, 1040, 1045 that contact the metal silicide electrodes 910. The device 200 is thereby connected to other semiconductor devices 1050 to form an integrated circuit 1060.

Forming the insulating layers 1010, 1015, 1020, 1025 can include forming a pre-metal layer dielectric layer 1010 over the device 200 and between the gate structure 205 and a gate structure 1070 of another adjacent device 1050 that is adjacent to the device 200 (e.g., a MOS transistor). Preferably the pre-metal dielectric layer 1010 is deposited after the sidewall spacer 410 and silicon oxide sidewall 420 are trimmed back as discussed above in the context of step 115 (FIG. 1) and FIG. 9. Trimming back these structures facilitates the deposition of a substantially void-free pre-metal dielectric layer 1010 between the gate structures 205, 1070. This is advantageous when the distance between the device 200 and adjacent device 1050 is small. E.g., a distance 1080 between a perimeter 1085 of the gate structure 205 of the device 200 and a perimeter 1090 of the gate structure 1070 the adjacent device 1050 can equal about 200 nanometers or less, and more preferably, 100 nanometers or less.

FIGS. 2-10 illustrate another embodiment of the invention: a method of manufacturing an integrated circuit 1080. An example embodiment of the method comprises forming one or more metal-oxide-semiconductor (MOS) transistor 200 over a semiconductor substrate 210. Any of the above-described embodiments of forming the semiconductor device 200 or other devices 1050 can be used. The method of manufacturing the integrated circuit 1080 further comprises forming insulating layers 1010, 1015, 1020, 1025 over the transistor 200 and forming interconnections 1030, 1035, 1040, 1045 that contact the metal silicide electrodes 910 of the device 200.

FIG. 10 illustrates still another embodiment of the invention: a semiconductor device 200. The device 200 comprises source and drain regions 510 in a semiconductor substrate 210, and a gate structure 205 located on the substrate 210 and adjacent the source and drain regions 510. The gate structure 205 comprises L-shaped silicon nitride sidewall spacers 410 formed by any of the above-described processes discussed in the context of e.g., FIG. 1 or FIGS. 4-8. E.g., forming the L-shaped silicon nitride sidewall spacers 410 comprises removing a first oxide layer 405 located on the source and drain regions 510, the first oxide layer 405 configured to serve as an etch stop layer for forming the L-shaped silicon nitride sidewall spacers 410, and depositing a second oxide layer 710 (FIG. 7) selectively onto the source and drain regions 510 that the first oxide layer 405 was removed from. Then, as shown in FIG. 8, lateral segments 810 from the L-shaped silicon nitride sidewall spacers 410 are removed. Preferably, the second oxide layer 710 is densified by a thermal anneal prior to removing the horizontal segments 810.

Those skilled in the art to which the invention relates will appreciate that other and further additions, deletions, substitutions, and modifications may be made to the described example embodiments, without departing from the invention.

The invention claimed is:

1. A method of manufacturing a semiconductor device, comprising:
    removing a first oxide layer deposited over a semiconductor substrate, thereby exposing source and drain regions of said substrate, wherein said first oxide layer is configured as an etch-stop for forming silicon nitride sidewall spacers of a gate structure located adjacent to said source and drain regions;
    depositing a second oxide layer selectively on said exposed source and drain regions;
    removing lateral segments of said silicon nitride sidewall spacer; and
    implanting dopants into said source and drain regions after removing said first oxide layer but before depositing said second oxide layer.

2. The method of claim 1, further comprising implanting dopants through said first oxide layer and into said source and drain regions.

3. The method of claim 1, wherein said second oxide layer has a thickness ranging from about 0.5 to 1.5 nanometers.

4. The method of claim 1, wherein said second oxide layer is densified by a thermal anneal prior to removing said lateral segments.

5. The method of claim 1, wherein no dopants are implanted through said second oxide layer prior to removing said lateral segments.

6. The method of claim 1, wherein removing said first oxide layer And depositing said second oxide layer are accomplished at temperatures of about 400° C. or less.

7. The method of claim 1, wherein depositing said second oxide layer comprises a wet clean comprising hydrogen peroxide, ozone or a mixture thereof at temperatures of about 60° C. or less.

8. The method of claim 1, wherein depositing said second oxide layer comprises an oxygen ash at temperatures of about 100° C. or less.

9. The method of claim 1, wherein removing said first oxide layer comprises a wet or dry etch conducted at temperatures of 200° C. or less.

10. The method of claim 1, said silicon nitride sidewall spacers are L-shaped sidewall spacers.

11. The method of claim 1, wherein removing portions of said silicon nitride sidewall spacers comprises a wet etch that removes said silicon nitride sidewall spacers at least about 100 times faster than said second oxide layer.

12. The method of claim 11, wherein said wet etch comprises hydrofluoric acid or phosphoric acid.

13. The method of claim 1, further comprising:
    performing a high temperature anneal to diffuse dopants into said source and drain regions;
    removing said second oxide layer;
    forming metal silicide electrodes on said source and drain regions formerly covered by said second oxide layer;
    forming insulating layers over said semiconductor device; and
    forming interconnections that contact said metal silicide electrodes thereby connecting said semiconductor device to other semiconductor devices to form an integrated circuit.

14. A method of manufacturing and integrated circuit comprising:
    forming one or more metal-oxide-semiconductor (MOS) transistor over a semiconductor substrate, comprising;
    forming a gate structure on said substrate, comprising depositing a first oxide layer on said substrate and over a gate electrode, wherein said first oxide layer is configured to serve as an etch stop layer for forming silicon nitride sidewall spacers on opposing side of a gate electrode;
    removing said first oxide layer from said substrate;
    depositing a second oxide layer selectively onto source and drain regions of said substrate that said first oxide layer was removed from;
    removing lateral segments of said silicon nitride sidewall spacers;
    performing a high temperature anneal to diffuse dopants into said source and drain regions of said substrate;
    removing said second oxide layer; and
    forming metal silicide electrodes on said source and drain regions formerly covered by said second oxide layer.

15. The method of claim 13, further including:
    forming insulating layers over said MOS transistors; and
    forming interconnections that contact said metal silicide electrodes.

16. The method of claim 13, wherein a distance covered by said first oxide layer located between said gate structures of a first and a second adjacent said MOS transistors equals about 100 nanometers or less.

17. The method of claim 13, further including fanning a pre-metal dielectric layer over and between gate structures of a first said MOS transistor and an adjacent second said MOS transistor, wherein said pre-metal dielectric layer is substantially free of voids.

18. A method of manufacturing a semiconductor device, comprising:
    removing a first oxide layer deposited over a semiconductor substrate, thereby exposing source and drain regions of said substrate, wherein said first oxide layer is configured as an etch-stop for forming silicon nitride sidewall spacers of a gate structure located adjacent to said source and drain regions;
    depositing a second oxide layer selectively on said exposed source and drain regions; and then
    forming lateral extensions by removing lateral segments of said silicon nitride sidewall spacer.

19. The method of claim 18, further comprising implanting dopants into said source and drain regions after removing said first oxide layer but before depositing said second oxide layer.

* * * * *